(12) United States Patent
Shen et al.

(10) Patent No.: US 10,050,188 B2
(45) Date of Patent: Aug. 14, 2018

(54) LIGHT EMITTING DIODE CHIP AND DISPLAY COMPOSED OF LIGHT EMITTING DIODE CHIPS

(71) Applicant: ADVANCED OPTOELECTRONIC TECHNOLOGY, INC., Hsinchu Hsien (TW)

(72) Inventors: Chia-Hui Shen, Hsinchu (TW); Tzu-Chien Hung, Hsinchu (TW); Chien-Chung Peng, Hsinchu (TW); Chien-Shiang Huang, Hsinchu (TW); Shih-Cheng Huang, Hsinchu (TW); Chih-Jung Liu, Hsinchu (TW)

(73) Assignee: ADVANCED OPTOELECTRONIC TECHNOLOGY, INC, Hsinchu Hsien (TW)

( * ) Notice: Subject to any disclaimer, the term of this patent is extended or adjusted under 35 U.S.C. 154(b) by 0 days.

(21) Appl. No.: 15/482,967

(22) Filed: Apr. 10, 2017

(65) Prior Publication Data

US 2018/0040793 A1 Feb. 8, 2018

(30) Foreign Application Priority Data

Aug. 4, 2016 (CN) .......................... 2016 1 0631704

(51) Int. Cl.
| | | |
|---|---|---|
| *H01L 29/20* | (2006.01) | |
| *H01L 33/00* | (2010.01) | |
| *H01L 33/64* | (2010.01) | |
| *H01L 25/075* | (2006.01) | |
| *H01L 33/38* | (2010.01) | |
| *H01L 33/08* | (2010.01) | |
| *H01L 33/62* | (2010.01) | |

(52) U.S. Cl.
CPC ........ *H01L 33/641* (2013.01); *H01L 25/0753* (2013.01); *H01L 33/08* (2013.01); *H01L 33/387* (2013.01); *H01L 33/62* (2013.01)

(58) Field of Classification Search
USPC ................ 257/81, 82, 91, 98–100, 116, 117, 257/432–437, 749, E33.056–E33.059, 79, 257/E25.032; 438/25–28, 29, 47
See application file for complete search history.

(56) References Cited

U.S. PATENT DOCUMENTS

| | | | | |
|---|---|---|---|---|
| 2011/0278609 | A1* | 11/2011 | Jeong ...................... | H01L 33/60 257/98 |
| 2013/0200398 | A1* | 8/2013 | Wang .................... | H01L 33/505 257/88 |
| 2014/0217433 | A1* | 8/2014 | Tudorica ............. | H01L 25/0753 257/89 |
| 2016/0260872 | A1* | 9/2016 | Butterworth ............ | H01L 33/54 |
| 2017/0133549 | A1* | 5/2017 | Xu ...................... | H01L 33/0075 |

FOREIGN PATENT DOCUMENTS

| | | |
|---|---|---|
| TW | 200901514 A | 1/2009 |
| TW | 201034251 A1 | 9/2010 |

\* cited by examiner

*Primary Examiner* — Tram H Nguyen
(74) *Attorney, Agent, or Firm* — ScienBiziP, P.C.

(57) ABSTRACT

A light emitting diode chip comprises a light emitting diode chip core and a coating layer. The coating layer covers side surfaces of the light emitting diode chip core. And a display composed of the light emitting diode chips is also provided.

11 Claims, 3 Drawing Sheets

LIGHT EMITTING DIODE CHIP AND DISPLAY COMPOSED OF LIGHT EMITTING DIODE CHIPS

FIELD

The subject matter herein generally relates to a light emitting device.

BACKGROUND

Light emitting diodes are widely used as display components in a display field. The display component includes light emitting diode chips and a base. Each light emitting diode chip is formed on the base. Overcoming heat dissipation problems and wavelength deviations are problematic.

BRIEF DESCRIPTION OF THE DRAWINGS

Implementations of the present technology will now be described, by way of example only, with reference to the attached figures.

DETAILED DESCRIPTION

Figure 1:
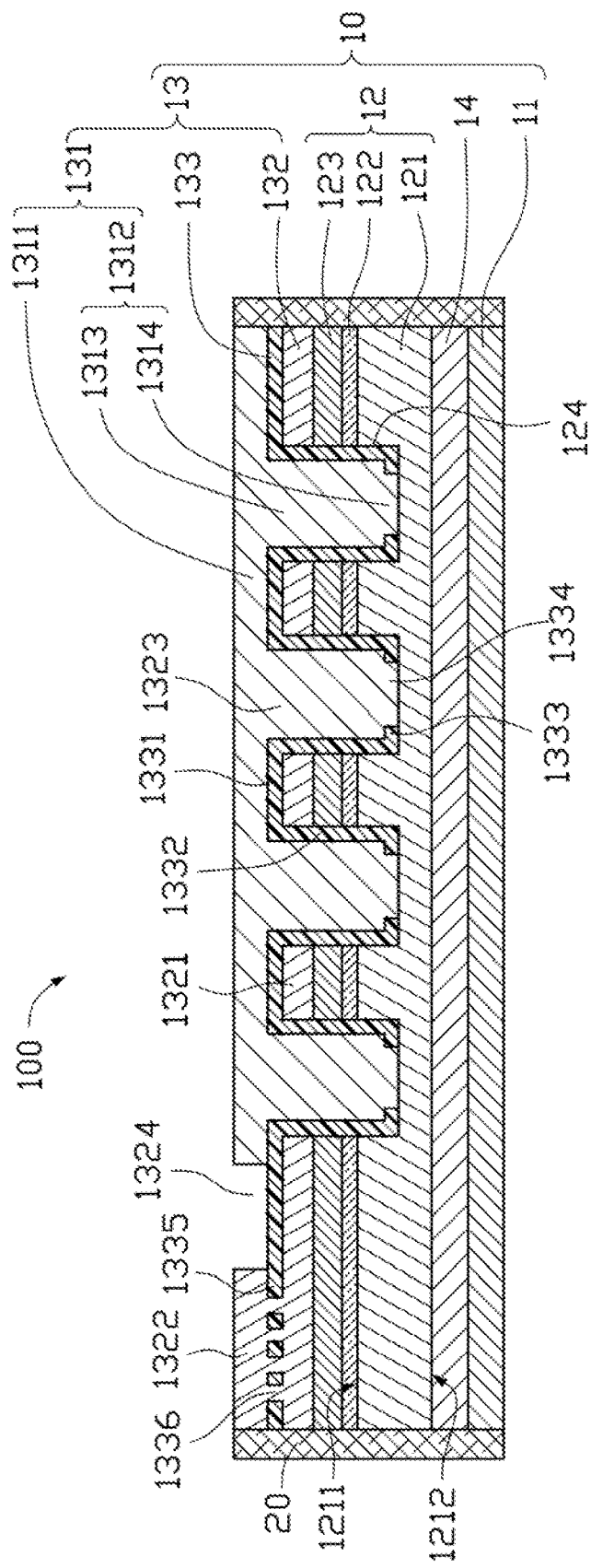
FIG. 1 is a cross-section view showing a light emitting diode chip in accordance with an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean at least one.

The term "comprising," when utilized, means "including, but not necessarily limited to"; it specifically indicates open-ended inclusion or membership in the so-described combination, group, series and the like.

A light emitting diode chip is disclosed. The light emitting diode chip comprises:
 a light emitting diode chip core; and
 a coating layer covering side surfaces of the light emitting diode chip core.

The coating layer comprises graphite, diamond-like carbon, and silicone.

The coating layer is coated on the light emitting diode chip core.

The light emitting diode chip core comprises a substrate, an epitaxial layer, and an electrically connecting layer.

The epitaxial layer comprises a first semiconductor layer, an active layer, and a second semiconductor layer. The first semiconductor layer, the active layer, and the second semiconductor layer are formed sequentially on the substrate.

The electrically connecting layer comprises a first electrode, a second electrode and an insulating layer, and the insulating layer is formed between the first electrode and the second electrode.

The first electrode is formed on the first semiconductor layer, and the second electrode formed on the second semiconductor layer.

A plurality of first holes is defined by the second electrode.

At least one receiving portion is defined by the epitaxial layer, and each open end of the receiving portion corresponds to a first hole.

The receiving portion is defined through the second semiconductor layer and the active layer, and a bottom surface of the receiving portion is defined at the first semiconductor layer.

The insulating layer comprises a plurality of first insulating portions and a plurality of second insulating portions. The first insulating portions are formed on the second electrode and separated from each other, and the second insulating portions are positioned between two adjacent first insulating portions and extend downwardly from the first insulating portions to the bottom surfaces of the receiving portions.

The first electrode comprises a first electrode plate formed on the first insulating portion and a plurality of filling blocks received in the first holes and the receiving portions.

The filling blocks of the first electrode are electrically connected to the first semiconductor layer, and the filling blocks of the first electrode are electrically insulated from the second electrode, the second semiconductor layer, and the active layer by the second insulating portions.

The second electrode comprises a second electrode plate formed on the second semiconductor layer and an additional block defined by the second electrode plate. The additional block extends upwardly from the second electrode plate.

A gap is defined between the additional block and the first electrode plate of the first electrode, a part of the first insulating portion of the insulating layer extends through a bottom end of the gap, and the gap is defined on the first insulating portion.

The insulating layer further comprises a plurality of third insulating portions connected to the second insulating portions. The third insulating portions are formed on the bottom surface of the receiving portion, and the third insulating portions partly cover the bottom surface of the receiving portion.

A receiving recess is defined between two adjacent third insulating portions, and a bottom surface of the receiving recess is the bottom surface of the receiving portion.

The insulating layer further comprises a fourth insulating portion formed in the second electrode. The fourth insulating portion is connected to the first insulating portion, and the fourth insulating portion is positioned between the second electrode plate and the additional block.

At least one second hole is defined by the fourth insulating portion, and a part of the second insulating portion is received in the second hole for electrically connecting with the second electrode plate.

A display composed of light emitting diode chips comprises:

a base;
a plurality of light emitting diode chips formed on the base and each of the light emitting diode chips comprising:
  a light emitting diode chip core; and
  a coating layer covering side surfaces of the light emitting diode chip core;
a plurality of wires electrically connected with the light emitting diode chips; and
a plurality of electrically connecting plates electrically connected with the wires.

FIG. 1 shows a light emitting diode chip 100 in accordance with an exemplary embodiment of the present disclosure.

The light emitting diode chip 100 comprises a light emitting diode chip core 10 and a coating layer 20. The coating layer 20 covers side surfaces of the light emitting diode chip core 10. The coating layer 20 can be made of graphite, diamond-like carbon, and silicone. The coating layer 20 can cover the light emitting diode chip core 10 by a coating process.

The light emitting diode chip core 10 comprises a substrate 11, an epitaxial layer 12, and an electrically connecting layer 13. The epitaxial layer 12 is formed on the substrate 11. The electrically connecting layer 13 is electrically connected with the epitaxial layer 12. The electrically connecting layer 13 can be formed on the epitaxial layer 12.

The substrate 11 can be made of sapphire, silicon carbide (SiC), pure silicon (Si), or gallium nitride (GaN), etc.

The epitaxial layer 12 comprises a first semiconductor layer 121, an active layer 122, and a second semiconductor layer 123. The first semiconductor layer 121, the active layer 122 and the second semiconductor layer 123 are formed on the substrate 11 in that sequence.

In at least one embodiment, the first semiconductor layer 121 can be an N-type doped semiconductor layer, and the second semiconductor layer 123 can be a P-type doped semiconductor layer. In an alternative embodiment, the first semiconductor layer 121 and the second semiconductor layer 123 can be a P-type doped semiconductor layer and an N-type doped semiconductor layer, respectively.

In one embodiment, the first semiconductor layer 121 is an N-type doped semiconductor layer, and the second semiconductor layer 123 is a P-type doped semiconductor layer.

The light emitting diode chip core 10 further comprises a buffer layer 14. The buffer layer 14 is formed between the substrate 11 and the first semiconductor layer 121.

The electrically connecting layer 13 comprises a first electrode 131, a second electrode 132, and an insulating layer 133. The insulating layer 133 is formed between the first electrode 131 and the second electrode 132. The first electrode 131 is electrically connected with the first semiconductor layer 121. The first electrode 131 is formed on the first semiconductor layer 121. The second electrode 132 is electrically connected with the second semiconductor layer 123. The second electrode 132 is formed on the second semiconductor layer 123. A plurality of first holes 1323 is defined by the second electrode 132.

At least one receiving portion 124 is defined by the epitaxial layer 12. Each open end of the receiving portion 124 corresponds to each first hole 1323. The receiving portion 124 is defined through the second semiconductor layer 123 and the active layer 122. A bottom surface of the receiving portion 124 can be defined at the first semiconductor layer 121.

The first semiconductor layer 121 defines a first surface 1211 and a second surface 1212 opposite to the first surface 1211. The first surface 1211 faces the active layer 122. In at least one embodiment, the bottom surface of the receiving portion 124 can be the first surface 1211. In an alternative embodiment, the bottom surface of the receiving portion 124 can be positioned between the first surface 1211 and the second surface 1212. In this embodiment, the bottom surface of the receiving portion 124 is positioned between the first surface 1211 and the second surface 1212.

The insulating layer 133 comprises a plurality of first insulating portions 1331 and a plurality of second insulating portions 1332.

The first insulating portions 1331 are formed on the second electrode 132. The first insulating portions 1331 are separate from each other.

The second insulating portions 1332 are positioned between two adjacent first insulating portions 1331 and extend downwardly from the first insulating portions 1331 to the bottom surfaces of the receiving portions 124. A top end of the second insulating portion 1332 is connected to the first insulating portion 1331, and a bottom end of the second insulating portion 1332 is connected to the bottom surface of the receiving portion 124. The second insulating portion 1332 covers a side surface of the first hole 1323 and a side surface of the receiving portion 124.

The insulating layer 133 further comprises a plurality of third insulating portions 1333. The third insulating portions 1333 are connected to the second insulating portions 1332. The third insulating portions 1333 are formed on the bottom surface of the receiving portion 124. The third insulating portions 1333 partly cover the bottom surface of the receiving portion 124. A receiving recess 1334 is defined between two adjacent third insulating portions 1333. A bottom surface of the receiving recess 1334 is the bottom surface of the receiving portion 124.

The first electrode 131 comprises a first electrode plate 1311 and a plurality of filling blocks 1312. The first electrode plate 1311 is formed on the first insulating portion 1331. The filling blocks 1312 are received in the first holes 1323 and the receiving portions 124. The filling blocks 1312 of the first electrode 131 are electrically connected to the first semiconductor layer 121. The filling blocks 1312 of the first electrode 131 are electrically insulated from the second electrode 132, the second semiconductor layer 123, and the active layer 122 by the second insulating portions 1332.

In at least one embodiment, each the filling block 1312 can define a first portion 1313 and a second portion 1314. The second portion 1314 is received in the receiving recess 1334, and the first portion 1313 is formed on the second portion 1314.

The second electrode 132 comprises a second electrode plate 1321 and an additional block 1322. The second electrode plate 1321 is formed on the second semiconductor layer 123. The additional block 1322 is defined by the second electrode plate 1321 and extends upwards from the second electrode plate 1321. A gap 1324 is defined between the additional block 1322 and the first electrode plate 1311 of the first electrode 131. A part of the first insulating portion 1331 of the insulating layer 133 extends to a bottom end of the gap 1324. The gap 1324 is defined on the first insulating portion 1331.

The insulating layer 133 can further comprise a fourth insulating portion 1335. The fourth insulating portion 1335 is formed in the second electrode 132. The fourth insulating portion 1335 is connected to the first insulating portion 1331. The fourth insulating portion 1335 is positioned between the second electrode plate 1321 and the additional block 1322. At least one second hole 1336 is defined by the fourth insulating portion 1335. A part of second insulating portion 1332 is received in the second hole 1336 for electrically connecting with the second electrode plate 1321.

Figure 2:
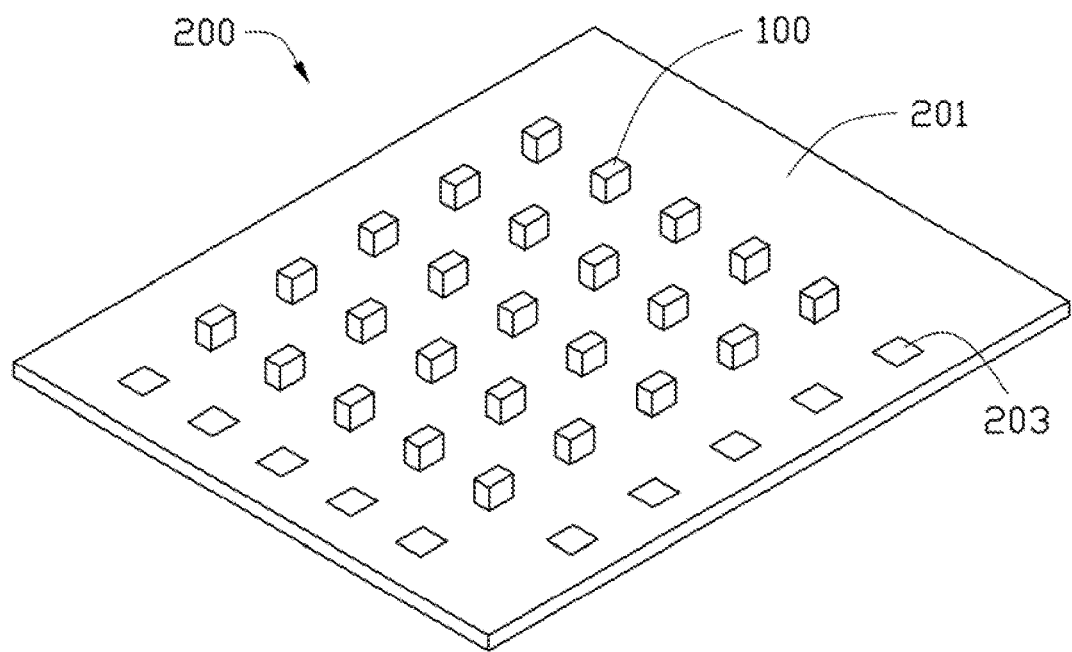
FIG. 2 is a schematic view showing a display in accordance with an exemplary embodiment of the present disclosure.
Figure 3:
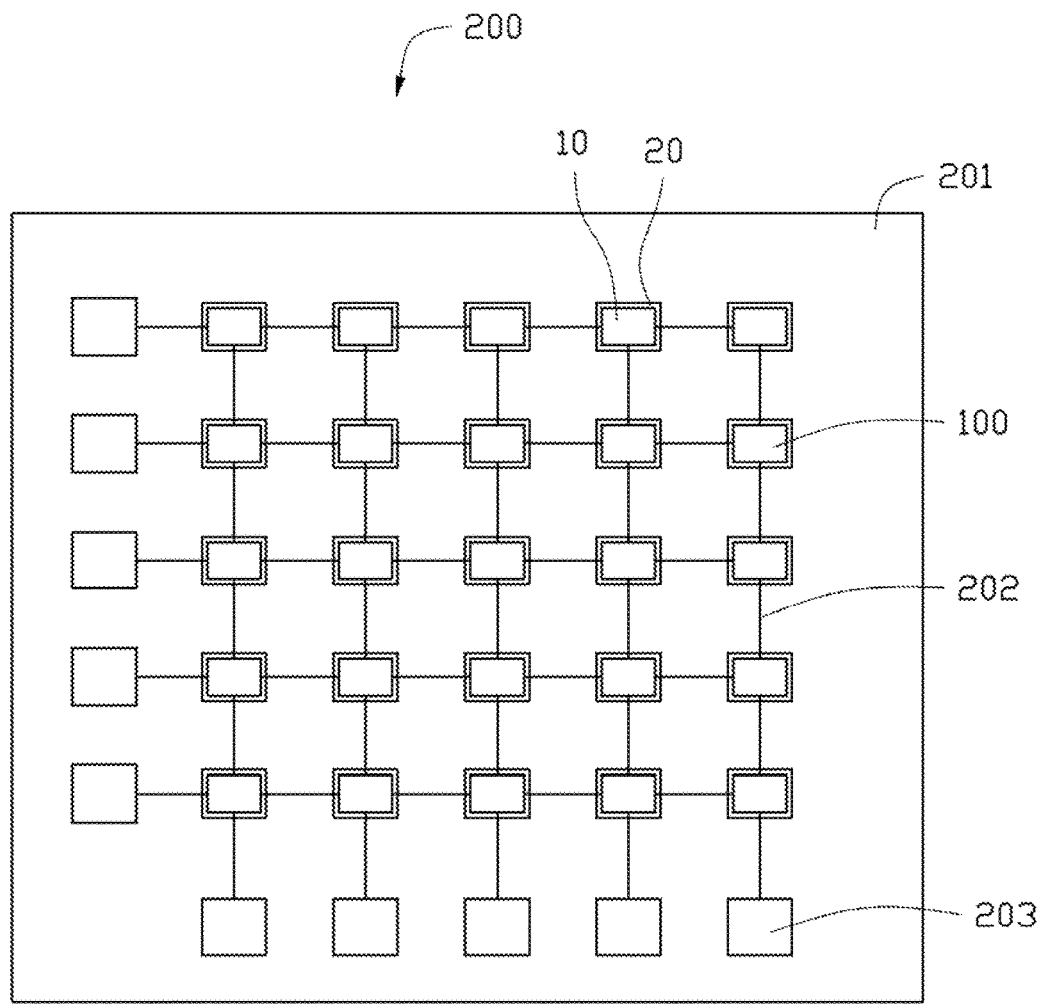
FIG. 3 is a top view of the display of FIG. 2.

Referring to FIGS. 2-3, FIG. 2 shows a display 200 according to the present disclosure, and FIG. 3 is a top view of the display 200 of FIG. 2.

The display 200 can be used in a telephone, a computer, or an e-reader. The display 200 comprises a base 201, the light emitting diode chips 100, a plurality of wires 202, and a plurality of electrically connecting plates 203. The light emitting diode chips 100, the wires 202 and the electrically connecting plates 203 are arranged on the base 201.

The light emitting diode chips 100 are electrically connected with the electrically connecting plates 203 by the wires 202. In at least one embodiment, the light emitting diode chips 100 can be in parallel electrically connected with each other by the wires 202. In at least one embodiment, the light emitting diode chips 100 can be in series electrically connected with each other by the wires 202. In an alternative embodiment, the light emitting diode chips 100 can be connected in series and in parallel by the wires 202.

The wires 202 can be made of gold, copper, or silver.

The electrically connecting plates 203 can be made of gold, copper, silver, or aluminum.

An embodiment of a method for producing the display 200 comprises:

providing a base 201;

forming a light emitting diode pre-layer (not shown);

cutting the light emitting diode pre-layer to generate the light emitting diode chip cores 10;

applying the coating layers 20 on each light emitting diode chip core 10 to generate the light emitting diode chips 100; and forming the electrically connecting the electrically connecting plates 203 on the base 201, and electrically connecting the electrically connecting plates 203 and the light emitting diode chips 100.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A light emitting diode chip comprising:
a light emitting diode chip core; and
a coating layer covering and directly connected to side surfaces of the light emitting diode chip core;
wherein the light emitting diode chip core comprises a substrate, an epitaxial layer, and an electrically connecting layer;
wherein the epitaxial layer comprises a first semiconductor layer, an active layer, and a second semiconductor layer, the first semiconductor layer, and the active layer and the second semiconductor layer are formed on the substrate successively;
wherein the electrically connecting layer comprises a first electrode, a second electrode, and an insulating layer, and the insulating layer is formed between the first electrode and the second electrode;
wherein the first electrode is formed on the first semiconductor layer, and the second electrode is formed on second semiconductor layer;
wherein a plurality of first holes is defined by second electrode;
wherein at least one receiving portion is defined by the epitaxial layer, and each open end of the receiving portion corresponds to a first hole;
wherein the receiving portion is defined through the second semiconductor layer and the active layer, and a bottom surface of the receiving portion is defined at the first semiconductor layer;
wherein the insulating layer comprises a plurality of first insulating portions and a plurality of second insulating portions, the first insulating portions are formed on the second electrode and separated from each other, and the second insulating portions are positioned between two adjacent first insulating portions and extend downwardly from the first insulating portions to the bottom surfaces of the receiving portions;
wherein the second electrode comprises a second electrode plate formed on the second semiconductor layer and an additional block defined by the second electrode plate, the additional block extends upwardly from the second electrode plate.

2. The light emitting diode chip of claim 1, wherein the coating layer comprises graphite, diamond-like carbon, and silicone.

3. The light emitting diode chip of claim 1, wherein the coating layer is coated on the light emitting diode chip core.

4. The light emitting diode chip of claim 1, wherein the first electrode comprises a first electrode plate formed on the first insulating portion and a plurality of filling blocks received in the first holes and the receiving portions.

5. The light emitting diode chip of claim 4, wherein the filling blocks of the first electrode are electrically connected to the first semiconductor layer, and the filling blocks of the first electrode are electrically insulated from the second electrode, the second semiconductor layer, and the active layer by the second insulating portions.

6. The light emitting diode chip of claim 1, wherein a gap is defined between the additional block and the first electrode plate of the first electrode, a part of the first insulating portion of the insulating layer extends through a bottom end of the gap, and the gap is defined on the first insulating portion.

7. The light emitting diode chip of claim 1, wherein the insulating layer further comprises a plurality of third insulating portions connected to the second insulating portions, the third insulating portions are formed on the bottom surface of the receiving portion, and the third insulating portions partly cover the bottom surface of the receiving portion.

8. The light emitting diode chip of claim 7, wherein a receiving recess is defined between two adjacent third insulating portions, and a bottom surface of the receiving recess is the bottom surface of the receiving portion.

9. The light emitting diode chip of claim 1, wherein the insulating layer further comprise a fourth insulating portion formed in the second electrode, the fourth insulating portion is connected to the first insulating portion, and the fourth insulating portion is positioned between the second electrode plate and the additional block.

10. The light emitting diode chip of claim 9, wherein at least one second hole is defined by the fourth insulating portion, and a part of the second insulating portion is received in the second hole for electrically connecting with the second electrode plate.

11. A display composed of light emitting diode chips comprising:
   a base;
   a plurality of light emitting diode chips formed on the base and each the light emitting diode chips comprising:
      a light emitting diode chip core; and
      a coating layer covering and directly connected to side surfaces of the light emitting diode chip core;
         wherein the light emitting diode chip core comprises a substrate, an epitaxial layer, and an electrically connecting layer;
         wherein the epitaxial layer comprises a first semiconductor layer, an active layer, and a second semiconductor layer, the first semiconductor layer, and the active layer and the second semiconductor layer are formed on the substrate successively;
         wherein the electrically connecting layer comprises a first electrode, a second electrode, and an insulating layer, and the insulating layer is formed between the first electrode and the second electrode;
         wherein the first electrode is formed on the first semiconductor layer, and the second electrode is formed on the second semiconductor layer;
         wherein a plurality of first holes is defined by the second electrode;
         wherein at least one receiving portion is defined by the epitaxial layer, and each open end of the receiving portion corresponds to a first hole;
         wherein the receiving portion is defined through the second semiconductor layer and the active layer, and a bottom surface of the receiving portion is defined at the first semiconductor layer;
         wherein the insulating layer comprises a plurality of first insulating portions and a plurality of second insulating portions, the first insulating portions are formed on the second electrode and separated from each other, and the second insulating portions are positioned between two adjacent first insulating portions and extend downwardly from the first insulating portions to the bottom surfaces of the receiving portions;
         wherein the second electrode comprises a second electrode plate formed on the second semiconductor layer and an additional block defined by the second electrode plate, the additional block extends upwardly from the second electrode plate;
   a plurality of wires electrically connected with the light emitting diode chips; and
   a plurality of electrically connecting plates electrically connected with the wires.

* * * * *